United States Patent
Marsland, Jr. et al.

(10) Patent No.: US 8,442,081 B2
(45) Date of Patent: May 14, 2013

(54) QUANTUM CASCADE LASER SUITABLE FOR PORTABLE APPLICATIONS

(75) Inventors: Rob Marsland, Jr., Madison, WI (US); Timothy Day, Poway, CA (US)

(73) Assignee: Daylight Solutions, Inc., San Diego, CA (US)

(*) Notice: Subject to any disclaimer, the term of this patent is extended or adjusted under 35 U.S.C. 154(b) by 0 days.

(21) Appl. No.: 13/455,761

(22) Filed: Apr. 25, 2012

(65) Prior Publication Data

US 2012/0210589 A1    Aug. 23, 2012

Related U.S. Application Data

(63) Continuation of application No. 12/782,509, filed on May 18, 2010, now Pat. No. 8,189,630, and a continuation of application No. 12/046,353, filed on Mar. 11, 2008, now Pat. No. 7,920,608.

(60) Provisional application No. 60/934,952, filed on Mar. 12, 2007, provisional application No. 61/035,283, filed on Mar. 10, 2008.

(51) Int. Cl.
*H01S 3/13* (2006.01)

(52) U.S. Cl.
USPC .................. 372/29.011; 372/29.012; 372/34

(58) Field of Classification Search ............. 372/29.011, 372/29.012
See application file for complete search history.

(56) References Cited

U.S. PATENT DOCUMENTS

| | | | |
|---|---|---|---|
| 4,737,028 A | 4/1988 | Smith | |
| 4,796,266 A | 1/1989 | Banwell et al. | |
| 5,082,799 A | 1/1992 | Holmstrom et al. | |
| 5,315,436 A | 5/1994 | Lowenhar | |
| 5,751,830 A | 5/1998 | Hutchinson | |
| 5,901,168 A | 5/1999 | Baillargeon et al. | |
| 6,134,257 A | 10/2000 | Capasso et al. | |
| 6,326,646 B1 | 12/2001 | Baillargeon et al. | |
| 6,400,744 B1 | 6/2002 | Capasso et al. | |
| 6,470,036 B1 | 10/2002 | Bailey et al. | |
| 6,553,045 B2 | 4/2003 | Kaspi | |
| 6,575,641 B2 | 6/2003 | Yamabayashi et al. | |
| 6,636,539 B2 | 10/2003 | Martinsen | |
| 6,690,472 B2 | 2/2004 | Kulp et al. | |
| 6,803,577 B2 | 10/2004 | Edner et al. | |
| 6,859,481 B2 | 2/2005 | Zheng | |

(Continued)

FOREIGN PATENT DOCUMENTS

| DE | 10205310 | * | 9/2003 |
|---|---|---|---|
| DE | 10205310 A1 | | 9/2003 |

(Continued)

OTHER PUBLICATIONS

U.S. Appl. No. 61/035,283, filed Mar. 10, 2008.

(Continued)

*Primary Examiner* — Dung Nguyen
(74) *Attorney, Agent, or Firm* — Roeder & Broder LLP

(57) ABSTRACT

A highly portable, high-powered infrared laser source is produced by intermittent operation of a quantum cascade laser power regulated to a predetermined operating range that permits passive cooling. The regulation process may boost battery voltage allowing the use of a more compact, low-voltage batteries.

14 Claims, 4 Drawing Sheets

U.S. PATENT DOCUMENTS

| | | | |
|---|---|---|---|
| 7,032,431 | B2 | 4/2006 | Baum et al. |
| 7,061,022 | B1 | 6/2006 | Pham et al. |
| 7,088,076 | B2 | 8/2006 | Densham et al. |
| 7,492,806 | B2 | 2/2009 | Day et al. |
| 7,873,094 | B2 | 1/2011 | Day et al. |
| 7,920,608 | B2 | 4/2011 | Marsland, Jr. et al. |
| 8,050,307 | B2 | 11/2011 | Day et al. |
| 8,189,630 | B2 | 5/2012 | Marsland, Jr. et al. |
| 2002/0064198 | A1 | 5/2002 | Koizumi |
| 2002/0105699 | A1 | 8/2002 | Miracky et al. |
| 2002/0176473 | A1 | 11/2002 | Mouradian |
| 2003/0043877 | A1 | 3/2003 | Kaspi |
| 2003/0127596 | A1* | 7/2003 | Kosterev et al. ......... 250/339.13 |
| 2004/0013154 | A1 | 1/2004 | Zheng |
| 2004/0208602 | A1 | 10/2004 | Plante |
| 2004/0228371 | A1 | 11/2004 | Kolodzey et al. |
| 2004/0238811 | A1 | 12/2004 | Nakamura et al. |
| 2004/0264523 | A1 | 12/2004 | Posamentier |
| 2005/0207943 | A1 | 9/2005 | Puzey |
| 2005/0213627 | A1 | 9/2005 | Masselink et al. |
| 2006/0056466 | A1 | 3/2006 | Belenky et al. |
| 2006/0268947 | A1 | 11/2006 | Kalayeh |
| 2007/0030865 | A1 | 2/2007 | Day et al. |
| 2007/0291804 | A1 | 12/2007 | Day et al. |
| 2008/0075133 | A1 | 3/2008 | Day et al. |
| 2008/0198027 | A1 | 8/2008 | Bugge |
| 2008/0232413 | A1 | 9/2008 | Leavitt et al. |
| 2009/0110019 | A1 | 4/2009 | Houde-Walter et al. |
| 2009/0224153 | A1 | 9/2009 | Houde-Walter |
| 2010/0132581 | A1 | 6/2010 | Day et al. |

FOREIGN PATENT DOCUMENTS

| | | |
|---|---|---|
| EP | 0877 454 A1 | 11/1998 |
| EP | 1971005 A1 | 9/2008 |
| JP | 2003/048480 A | 3/1991 |
| JP | 07-024322 B | 1/1995 |
| JP | 2005/317819 A | 11/2005 |
| WO | W092/20127 | 11/1992 |
| WO | WO03/067720 A2 | 8/2003 |
| WO | 2007050134 A3 | 5/2007 |
| WO | WO2008019392 A2 | 2/2008 |
| WO | W02008/036881 A2 | 3/2008 |
| WO | W02008/036884 A2 | 3/2008 |

OTHER PUBLICATIONS

U.S. Appl. No. 60/934,952, filed Mar. 12, 2007.
Reply to Extended Search Report for European Application No. 08152655.0, dated Apr. 13, 2011, Daylight Solutions, Inc. (provided in parent application).
Extended Search Report for European Application No. 08152655.0, dated Sep. 15, 2010, Daylight Solutions, Inc. (provided in parent application).
Reply to Extended Search Report for European Application No. 06844137.7, dated Oct. 18, 2010, Daylight Solutions, Inc.
Supplementary European Search Report for European Application No. 08152655.0, dated Mar. 31, 2010, Daylight Solutions, Inc.
S. Blaser et al., Alpes Lasers, Room-temperature continuous-wave single-mode quantum cascade lasers, Photonics West 2006, Novel In-Plane Semiconductors V:Quantum Cascade Lasers:6133-01 Switzerland (provided in related case U.S. Appl. No. 12/046,353).
Gaetano Scamarcio, Mid-IR and THz Quantum Cascade Lasers, 2005, Physics Dept., University of Bari, Bari Italy (provided in related case U.S. Appl. No. 12/046,353).
Gaetano Scamarcio et al., Micro-probe characterization of QCLs correlation with optical performance, APL 78, 1177 & APL 78, 2095 (2001), APL 2002, APL 2004, University of Bari, Bari Italy (provided in related case U.S. Appl. No. 12/046,353).
Corrie David Farmer, "Fab and Eval. of QCL's", Sep. 2000, Faculty of Engineering, University of Glasgow, Glasgow, UK (provided in related case U.S. Appl. No. 12/046,353).
J. Faist, THz and Mid-IR Quantum cascade lasers, QM in space, Chatillon, Mar. 31, Science 2002, University of Neuchatel, EU Projects Answer/Teranova; Agilent, Funding Swiss National Science Foundation (provided in related case U.S. Appl. No. 12/046,353).
Joel M. Hensley, Recent Updates in QCL-based Sensing Applications, Sep. 5-10, 2006, Physical Sciences, Inc., Andover, MA, 2nd International Workshop on Quantum Cascade Lasers, Ostuni, Italy (provided in related case U.S. Appl. No. 12/046,353).
J.M. Hensley et al., Demonstration of an External Cavity Terahertz Quantum Cascade Laser, Copyright 2005, Optical Society of America, Washington, DC 20036 (provided in related case U.S. Appl. No. 12/046,353).
L. Hildebrandt et al., Quantum cascade external cavity and DFB laser systems in the mid-infrared spectral range: devices and applications, 2004, Marburg Germany (provided in related case U.S. Appl. No. 12/046,353).
Richard Maulini et al., Broadly tunable external cavity quantum-cascade lasers, 2005, University of Neuchatel, Neuchatel Switzerland (provided in related case U.S. Appl. No. 12/046,353).
Tsekoun, A. et al; "Improved performance of QCL's through a scalable, manufacturable epitaxial-side-down mounting process"; Feb. 2006 (provided in related case U.S. Appl. No. 12/046,353).
Pushkarsky, M. et al.; "Sub-parts-per-billion level detection of NO2 using room temp. QCLs"; May 2006 (provided in related case U.S. Appl. No. 12/046,353).
Wirtz, D. et al.; A tuneable heterodyne infrared spectrometer; Physikalisches Institut; University of Koln; Koln Germany Spectrochimica 2002 (provided in related case U.S. Appl. No. 12/046,353).
Williams, B. et al.;"Terahertz QCLs and Electronics"; PhD-MIT 2003 (provided in related case U.S. Appl. No. 12/046,353).
Hildebrandt, L.et al.."Quantum cascade external cavity laser systems in the mid-infrared spectral range," 2004, Sacher Lasertechnik Group, Marburg, Germany (provided in related case U.S. Appl. No. 12/046,353).
U.S. Appl. No. 11/464,094, filed Aug. 14, 2006.
Search Report and Written Opinion for PCT/US2007/075712 dated Sep. 2, 2008, related to WO2008/019392A2, cite No. 7 above, foreign patent documents, (provided in related case U.S. Appl. 12/046,353.
Miles J. Weida, David Arnone, Timothy Day, Tunable QC laser opens up mid-IR sensing applications, Jul. 1, 2006, Opto IQ, Laser Focus World; http://www.laserfocusworld.com/articles (provided in related case U.S. Appl. No. 12/046,353).
D. Weidmann et al., Development of a compact quantum cascade laser spectrometer for field measurements of CO 2 isotopes, Feb. 1, 2005, pp. 255-260, Applied PhysicsB, Lasers and Optics, Appl. Phys. B 80, published online: Sep. 29, 2004 © Springer-Verlag 2004 (provided in parent case U.S. Appl. No. 12/782,509).
G. Totschig et al.,Mid-infrared external-cavity quantum-cascade laser XP-001161786, Oct. 15, 2002, pp. 1788-1790, Optics Letters/vol. 27, No. 20, © 2002 Optical Society of America (provided in parent case U.S. Appl. No. 12/782,509).
G.P. Luo et al.,Grating-tuned external-cavity quantum-cascade semiconductor lasers, May 7, 2001, Applied Physics Letters, vol. 78, No. 19, © 2001 American Institute of Physics (provided in parent case U.S. Appl. No. 12/782,509).
G. Wysocki et al.,Widely tunable mode-hop free external cavity quantum cascade laser for high resolution spectroscopic applications, Jul. 27, 2005, Applied Physics, B81, pp. 769-777, Applied Physics B Lasers and Optics (provided in parent case U.S. Appl. No. 12/782,509).
Day et al., Miniaturized External Cavity Quantum Cascade Lasers for Broad Tunability in the Mid-Infrared, May 21, 2006, 1-55752-813-6, Lasers and Electro-Optics and 2006 Quantum Electronics and Laser Science Conference, © 2006 IEEE (provided in parent case U.S. Appl. No. 12/782,509).
Thierry Aellen et al.,Continuous-wave distributed-feedback quantum-cascade lasers on a Peltier cooler, Sep. 8, 2003, pp. 1929-1931, Applied Physics Letters, vol. 83, No. 10, © 2003 American Institute of Physics (provided in parent case U.S. Appl. No. 12/782,509).
Martini, Ranier et al.,"High duty cycle operation of quantum cascade lasers based on graded superlattice active regions,"Journal of Applied Physics, Jun. 15, 2001, pp. 7735-7738,vol. 89, No. 12, XP012052642 ISSN:0021-8979, © 2001 American Institute of Physics (provided in parent case U.S. Appl. No. 12/782,509).

Sitori, Carlo et al.,"Mid-Infrared (8.5 μm) Semiconductor Lasers Operating at Room Temperature," IEEE Photonics Technology Letters, Mar. 1997, pp. 297-299, vol. 9, No. 3, XP000684396, ISN:1041-1135, © 1997 IEE (provided in parent case U.S. Appl. No. 12/782,509).

Dominic P. Ciminello (from Law Firm—Harter Secrest & Emery LLP), Letter dated May 28, 2010 citing references that they believed to be relevant to U.S. Appl. No. 12/046/353, 4 pages, Rochester, NY. (provided in related case U.S. Appl. No. 12/046,353).

European Search Report for European Application No. 08160414.2, publication date Dec. 9, 2008, Daylight Solutions, Inc. (provided in related case U.S. Appl. No. 12/046,353).

* cited by examiner

QUANTUM CASCADE LASER SUITABLE FOR PORTABLE APPLICATIONS

CROSS-REFERENCE TO RELATED APPLICATIONS

This application is a continuation of U.S. application Ser. No. 12/782,509 filed on May 18, 2010 and entitled "QUANTUM CASCADE LASER SUITABLE FOR PORTABLE APPLICATIONS" which is issued under U.S. Pat. No. 8,189,630 B2 on May 29, 2012. U.S. application Ser. No. 12/782,509 is a continuation of U.S. application Ser. No. 12/046,353 filed on Mar. 11, 2008, and entitled "QUANTUM CASCADE LASER SUITABLE FOR PORTABLE APPLICATIONS" now issued under U.S. Pat. No. 7,920,608 B2 on Apr. 5, 2011. U.S. application Ser. No. 12/046,353 claims priority on U.S. Provisional Application Ser. No. 60/934,952 filed Mar. 12, 2007, and on U.S. Provisional Application Ser. No. 61/035,283 filed Mar. 10, 2008. As far as is permitted, the contents of U.S. application Ser. No. 12/782,509; U.S. application Ser. No. 12/046,353; U.S. Provisional Application Ser. No. 60/934,952; and U.S. Provisional Application Ser. No. 61/035,283; each of which is incorporated herein by reference.

BACKGROUND OF THE INVENTION

The present invention relates to laser systems and, in particular, to compact lasers suitable for military, handheld weapon targeting systems, for example.

Laser targeting systems, often called laser sights, may use a lightweight laser mounted to a gun so that its beam is generally aligned with the bore of the gun. In this position, the laser may project a small illuminated spot on the target assisting in alignment of the weapon. In order for the spot to be seen in bright environments and to project for an adequate distance, a continuous wave solid-state laser of high power is normally employed.

In a military application, the projection of visible light may provide advanced notice to the target and may in fact reveal the location of a soldier holding the laser-sighted weapon. For this reason, there is considerable interest in the use of infrared laser sight systems that are only visible using far-infrared imaging systems. Unfortunately, conventional solid-state laser diodes have insufficient output in the desired infrared region.

SUMMARY OF THE INVENTION

The present applicants have recognized that a narrow operating range exists in which an intermittently operated quantum cascade laser can provide sufficient brightness for a laser sight or other similar application without active cooling. Further, power sensing feedback regulation can be used to maintain the quantum cascade laser precisely within this operating region. Eliminating the active cooling allows the device to be powered through low voltage, low ampere-hour batteries (suitable for portable use) as boosted with a high efficiency boost converter.

Specifically, embodiments of the present invention provide a low power consumption quantum cascade laser having a housing containing a passive cooling element and a solid-state quantum cascade laser element thermally attached to the passive cooling element. A window through the housing and aligned with the solid-state quantum cascade laser element allows a laser beam to pass out of the housing from the solid-state quantum cascade laser element. A quantum cascade laser driver circuit receives electrical power from a battery and provides a set of feedback-controlled pulses to the solid-state quantum cascade laser element having a duty cycle of less than 50% allowing operation of the quantum cascade laser without active cooling while providing high peak power pulses.

Thus, it is a feature of an embodiment of the invention to permit the use of a quantum cascade laser in applications requiring a high degree of portability.

The driver circuit may sense current to the quantum cascade laser so that the current to the quantum cascade laser is precisely regulated.

It is thus a feature of an embodiment of the invention to continuously monitor and dynamically adjust the power to the quantum cascade laser to hold it within a narrow operating range allowing passive cooling. Current sensing provides a proxy for the power consumed by the quantum cascade laser.

Alternatively, the driver circuit may control the pulses based on a direct sensing of optical output of the quantum cascade laser.

It is thus a feature of an embodiment of the invention to allow the operating condition of the quantum cascade laser to be deduced directly from its optical output.

The quantum cascade laser driver circuit may provide a DC-to-DC boost converter providing power to the quantum cascade laser element, where the duty cycle of the boost converter is controlled by feedback measuring the power consumed by the quantum cascade laser element.

It is thus a feature of an embodiment of the invention to minimize power loss in the feedback circuitry necessary to hold the quantum cascade laser in its safe operating mode. By employing the same circuitry used to boost the battery voltages to regulate power to the quantum cascade laser additional circuitry losses are eliminated.

The passive cooling element may include portions of the housing.

It is thus a feature of an embodiment of the invention to maximize the passive cooling that may be obtained in a small form-factor.

The housing may be airtight.

It is thus a feature of an embodiment of the invention to provide a rugged device that may be used in abusive environments.

The battery source may provide a voltage of less than 9 V.

It is thus a feature of an embodiment of the invention to allow the use of smaller low voltage batteries having a total voltage less than the operating voltage of the quantum cascade laser.

The volume of the housing may be less than 10 cm.sup.3.

It is thus a feature of an embodiment of the invention that it may be used to produce quantum cascade lasers suitable for highly portable sensing and ranging applications including laser sights or portable gas spectroscopy systems.

These particular objects and advantages may apply to only some embodiments falling within the claims and thus do not define the scope of an embodiment of the invention.

DETAILED DESCRIPTION OF CERTAIN EMBODIMENTS

A possible substitute for a conventional laser diode in this application is the so-called quantum cascade laser. Unlike a conventional laser diode which relies on relatively large band gaps in solid-state semiconductors, the quantum cascade laser allows the development of sub bands with lower energy differences suitable for producing long wavelengths of infrared light. Because quantum cascade lasers do not rely on electron/hole annihilation to produce photons, multiple photons may be created for each electron providing high light power output. Such quantum cascade lasers require relatively high operating voltages and dissipate substantial heat. This heat ultimately inhibits the lasing action (reducing the number of photons per electron) and in the extreme can damage the device. For this reason it is known to use active cooling of the quantum cascade laser, for example with an electrically powered Peltier device and fan combination.

The large power consumption and high voltage requirements of a continuous wave quantum cascade laser and the need for additional power to cool the quantum cascade device presents a significant obstacle to the use of quantum cascade lasers for laser sights or other portable applications.

Figure 1:
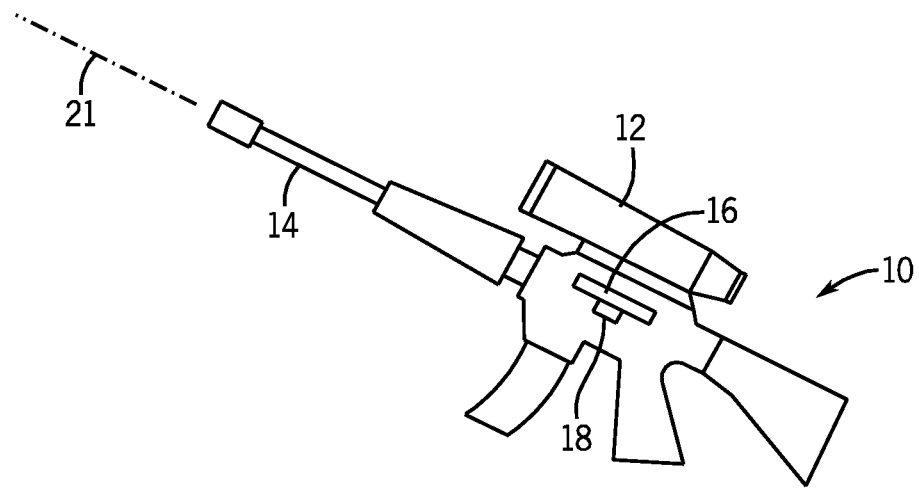
FIG. 1 is a perspective view of a rifle including a laser sight in accordance with an embodiment of the present invention using a quantum cascade laser element.

Referring now to FIG. 1, a rifle 10 may provide a thermal imaging device 12 of a type known in the art for allowing a user of the rifle 10 to sight along the barrel 14 of rifle and view an image in the far infrared range (thermal image). A battery-powered quantum cascade laser 16 in accordance with an embodiment of the present invention may be attached to the rifle 10 by means of mount 18 to provide a laser beam 21 aligned along the barrel 14 to assist in targeting the rifle 10 by projecting an invisible infrared spot on a target.

Figure 2:
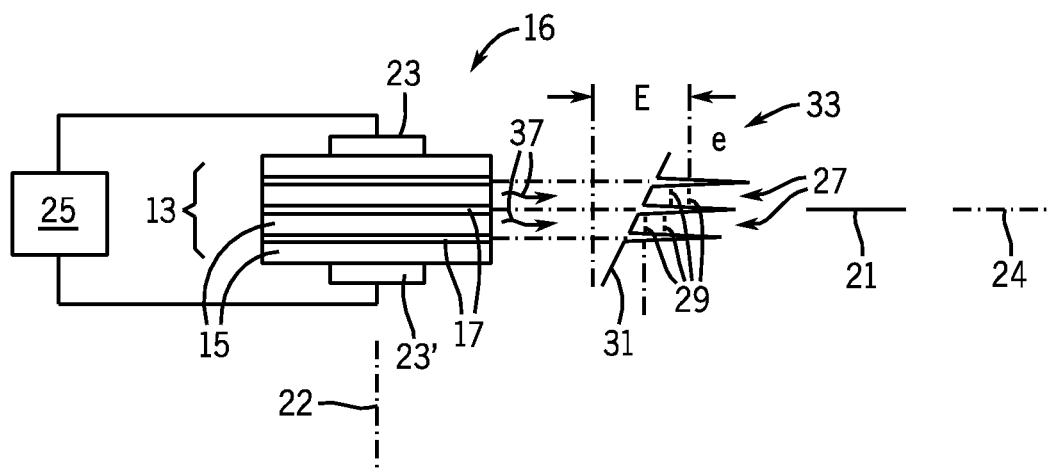
FIG. 2 is a simplified diagram of the quantum cascade laser element used in the laser in accordance with an embodiment of the present invention showing generation of stimulated emissions by cascaded electron intraband transitions and tunneling.

Referring to FIG. 2, at the heart of the quantum cascade laser 16 is a quantum cascade laser element 26 comprising a stack 13 of semiconductor layers 15 separated by barrier layers 17, the latter preventing classical electron flow. The number and types of layers shown in FIG. 2 are greatly reduced for clarity.

The stack 13 extends generally along an axis 22 with each of the layers 15 and 17 extending in a plane generally perpendicular to the axis 22. The outer layers 15 are attached to electrodes 23 and 23' which may be biased with an electrical voltage source from a driver circuit 25 to provide a relatively negative voltage at the top of the stack 13 at electrode 23. This negative voltage provides a source of electrons 33 that are drawn to a relatively positive voltage at the bottom of the stack 13 at electrode 23'.

The barrier layers 17 surrounding each semiconductor layer 15 provide a high dielectric electrical insulation that creates quantum well 27 shown in a potential energy line 31, the latter depicting generally the energy required for an electron 33 to move along axis 22. The potential energy line 31 decreases generally from the top of the stack 13 to the bottom of the stack 13 (per the applied voltage) but includes right extending peaks (as depicted) representing the electron barriers formed by the barrier layers 17 and thus the walls of the quantum wells 27.

The quantum wells 27 confine electrons 33 into thin planar regions to create sub bands 29 of permissible electron energy states for the electrons 33 within each quantum well 2. These sub bands differ from the normal energy bands of a bulk semiconductor with the energy of the sub bands 29 largely dictated by the geometry of the quantum well 27 rather than the material properties alone.

Under the influence of the electrical voltage from driver circuit 25, electrons 33 pass from electrode 23 to electrode 23' moving from quantum well 27 to quantum well 27 by tunneling through the barrier layers 17. Within each quantum well 27, the electrons 33 drop from higher subbands 29 to lower subbands 29 (intraband transition) resulting in the emission of photons 37 along an axis 24 perpendicular to axis 22. The difference in energy between higher and lower subbands 29 can produce light in the range of 3-10 microns or greater in each of the cascaded intraband transitions generating multiple photons per electron.

The intraband transition and tunneling process should be distinguished from classic electron/hole pair combinations found in conventional semiconductor laser diodes because an electron/hole pair is not extinguished upon the formation of the photon 37 in a quantum cascade laser 16.

The vertical edges of the stack 13 provide partially reflective surfaces to create a laser cavity allowing the stimulated emission of photons 37 as a laser beam 21.

Figure 3:
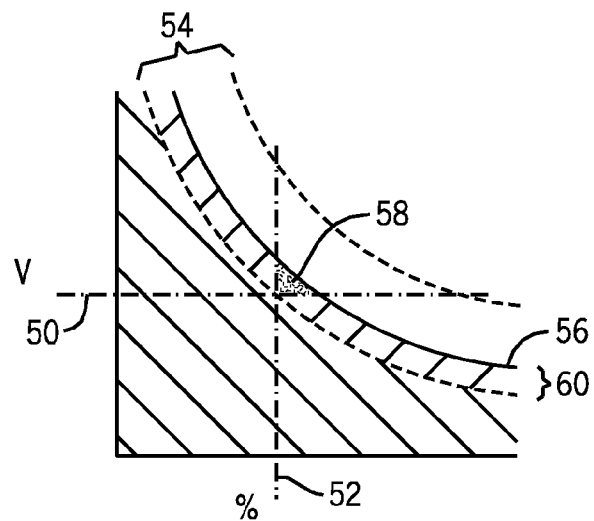
FIG. 3 is a plot of applied voltage and duty cycle of power applied to the quantum cascade laser element superimposed on a passive cooling boundary and an open-loop quantum cascade power output range for a given voltage showing a safe operating zone for the quantum cascade laser exploited by an embodiment of the present invention.

Referring now to FIG. 3, the quantum cascade laser element 26 requires a lasing threshold voltage 50 of approximately 20 volts to begin laser action as shown on the vertical axis. This voltage is substantially higher than conventional solid-state lasers and is a natural result of the physics of the device which requires the passage of electrons in cascade through a series of quantum wells of different voltages. Generally, batteries having sufficient amp-hour capacity and a voltage of 20 volts or higher are unsuitably heavy or bulky for a hand-held military weapon.

The average power consumption of the quantum cascade laser element 26 may be controlled by pulsed operation at a duty cycle shown on the horizontal axis. A duty cycle above a predetermined duty cycle threshold 52 is required, however, in order to provide sufficient output power for remote ranging, that is, to provide sufficient reflected power from a distant projected spot.

Together, the lasing threshold voltage 50 and duty cycle threshold 52 provide lower bounds of a safe zone 58 in which the quantum cascade laser element 26 may operate. A passive cooling boundary 56 describes the maximum power that may be dissipated by the quantum cascade laser element 26 with passive cooling without damaging or significantly degrading the quantum cascade laser element when operating at expected ambient operating temperatures. The passive cooling boundary 56 describes the upper bounds of the safe zone 58.

It is generally possible for the passive cooling boundary 56 to be below the lower bounds of the safe zone 58 defined by the lasing threshold voltage 50 and duty cycle threshold 52; however, the present inventors have determined that optimizing the passive cooling by reducing the thermal resistance between the quantum cascade laser element 26 and the ambient air, a small but finite safe zone 58 for practical form factors is created.

Given the low incremental resistance of many cascade laser elements, variations in the IV characteristics of a given quantum cascade laser element 26, or slight drift in the applied voltage, define an electrical power dissipation band 54 for the quantum cascade laser element 26 that generally is not coextensive with the safe zone 58. Thus even though there is a theoretical safe zone 58, the present inventors have further determined that a given voltage and duty cycle of operation cannot guarantee operation within the safe zone 58.

This failure of the safe zone 58 to be coextensive with the power output band 54 requires ancillary feedback stabilization of the power to the quantum cascade laser to maintain its operation within a sub band 60 of the power output band 54. Accordingly, as will be described in more detail below, an embodiment of the present invention provides power-sensing regulation that ensures operation within sub band 60.

Figure 4A:
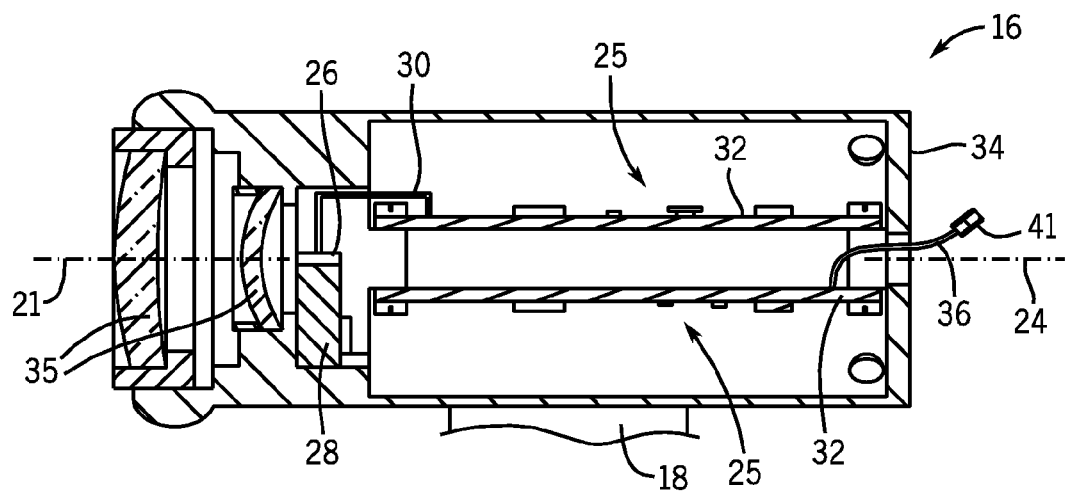
FIG. 4a is a cross-sectional view of the housing of a laser sight of FIG. 1 showing a mounting system for the quantum cascade laser for passive cooling as held within the housing and showing the positioning of quantum cascade driving circuitry in accordance with an embodiment of the present invention.

Referring now to FIG. 4a, the quantum cascade laser 16 may include a tubular housing 20 preferably formed from a thermally conductive material such as aluminum or the like. Within the housing, the quantum cascade laser element 26 may be attached to a passive heatsink 28 so that its axis 24 is aligned generally with a central axis 24 of the tubular housing 20. A first end of the tubular housing 20 provides a window form by a lens system 35 allowing exit and collimation of the laser beam 21 formed by the photons 37.

The passive heatsink 28 is attached to the material of the housing 20 to conduct heat from the quantum cascade laser element 26 into the thermal mass of the passive heatsink 28 and then into the housing 20. Power to the quantum cascade laser is provided through a copper conductor 30 passing to a first and second printed circuit board 32 containing driver circuits 25 to power the quantum cascade laser element 26. Return power is conducted by means of a conductor attached to the housing 20 (not shown) and to the electrically conductive copper of the passive heatsink 28.

The end of the tubular housing 20 opposite the lens system 35 may be covered with a threaded end cap 34 to provide an airtight inner volume of the housing 20 between the lens system 35 and the threaded end cap 34. The volume may, for example, be less than 10 cubic centimeters. Leads 36 providing power to the printed circuit boards 32 may pass through a sealed opening in threaded end cap 34 to connect to a battery 41 that may be held by the user and that provides power to both the laser 16 and the thermal imaging device 12.

Figure 4B:
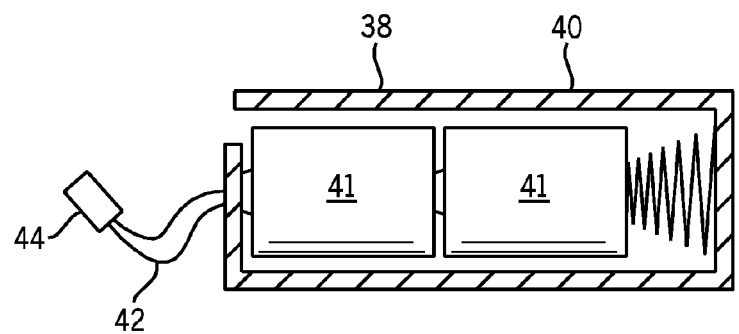
FIG. 4b is a fragmentary cross-sectional view similar to that of FIG. 4a showing another embodiment with self-contained batteries.

Alternatively as shown in FIG. 4b, the threaded end cap 34 may be replaced with a threaded battery housing 38 supporting for example two, 3 volt lithium ion batteries held in series connection by a battery holder 40 having leads 42 joining connector 44 that may connect to the printed circuit boards 32.

Figure 5:
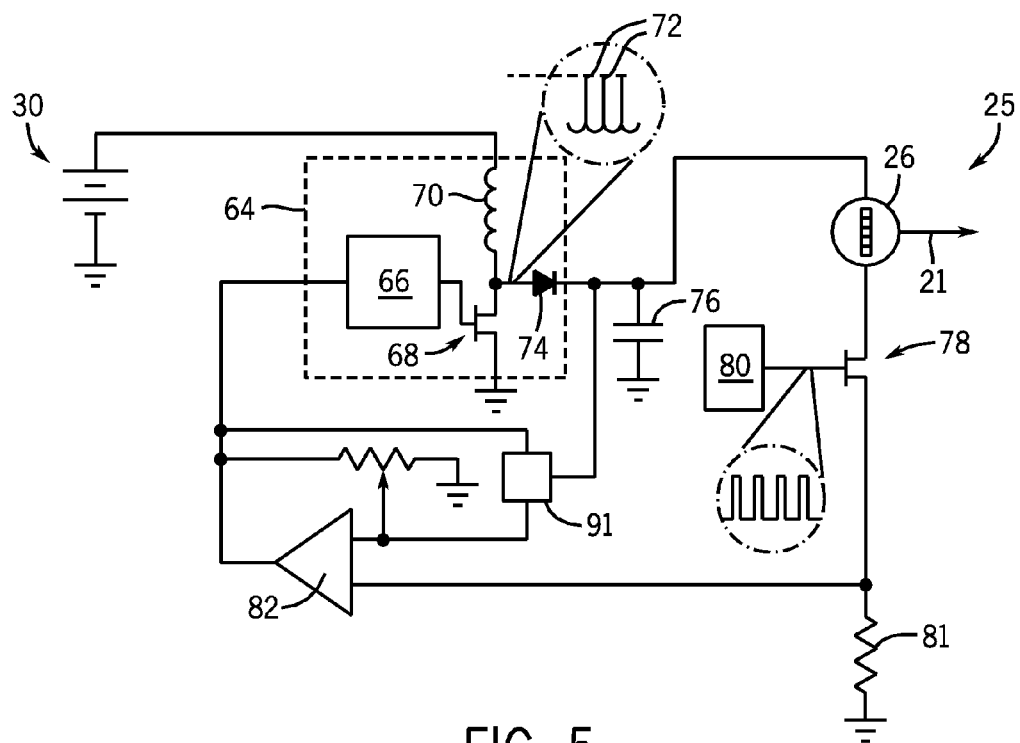
FIG. 5 is a block diagram of the quantum cascade driving circuit of FIG. 2 providing current sensing to deduce quantum cascade power output for direct control of a DC-to-DC boost converter in accordance with an embodiment of the present invention.

Referring now to FIG. 5, the quantum cascade driver circuit 25 described above may accept low-voltage electrical power, for example 6 V from batteries 41, and provide that power to a boost converter circuit 64. As is generally understood in the art, the boost converter circuit 64 includes a control circuit 66 switching on and off a solid-state switch 78 connected in series with an inductor 70. The other end of the inductor 70 is connected to the low voltage electrical power and the other end of the switch 68 is connected to ground.

The control circuit 66 operates to charge the inductor 70 by periodically switching on the solid-state switch 68, and then to turn off the switch 68 to generate an inductively driven pulse 72 of voltage higher than the voltage of batteries 41 at the junction of the solid-state switch 78 and inductor 70. The voltage level of pulses 72 will depend in part on the duration of on-time of the solid-state switch 68 and thus the amount of charging of the inductor 70.

The pulses 72 are conducted through a diode 74 to a capacitor 76, the latter filtering the pulses to provide a source of DC voltage whose level is determined by the circuit 66. This voltage will be above the lasing threshold voltage 50. The DC voltage is in turn provided to one terminal of quantum cascade laser element 26.

The second terminal of the quantum cascade laser element 26 is connected in series with a second solid-state switch 78 controlled by a pulsing circuit 80. The pulsing circuit 80 provides pulses having a duty cycle above predetermined duty cycle threshold 52. The voltage of the pulses 72 must at a minimum be above the threshold voltage 50 described above but can be controlled in amplitude as will be described. Typically the pulses will have 100 ns to 1.mu.s duration with a maximum duty cycle of 25% and will occur at approximately 500 kHz in frequency.

When the solid-state switch 78 is on (receiving a pulse from pulsing circuit 80) current is conducted through the quantum cascade laser 86, through the solid-state switch 78, and through sensing resistor 81 to ground. While the voltage at capacitor 76 is a relatively poor proxy for power consumed by the quantum cascade laser element 26, the current through the quantum cascade laser element 26 and hence through sensing resistor 81 provides a relatively good proxy for that power consumption quantum cascade laser element 26. This current is measured by differential amplifier 82 to provide a current level input to the circuit 66 controlling the on time of solid-state switch 68 and thus the voltage of the pulses 72. In this way, amplifier 82 completes a feedback loop to control the voltage of the pulses 72, and thus the voltage being applied to the quantum cascade laser element 26, to produce a given current flow and hence power dissipation in the quantum cascade laser element 26. The gain of amplifier 82 is set to adjust the operating conditions of the quantum cascade laser element 26 to be held within sub band 60 of FIG. 6 and thus within safe zone 58.

The driver circuit 25 may also include a clamp circuit 91 receiving voltage at the cathode of diode 74 and controlling the feedback signal to control circuit 66 to limit the maximum voltage of the pulses 72 for safety, and further may provide for a timer limiting the maximum on time of the quantum cascade laser element 26 to comport with the heat sinking capacity of the passive heatsink 28 in a particular environment. The clamp circuit 91 may employ a solid-state switch switching at a predetermined threshold voltage as will be understood in the art.

Figure 6:
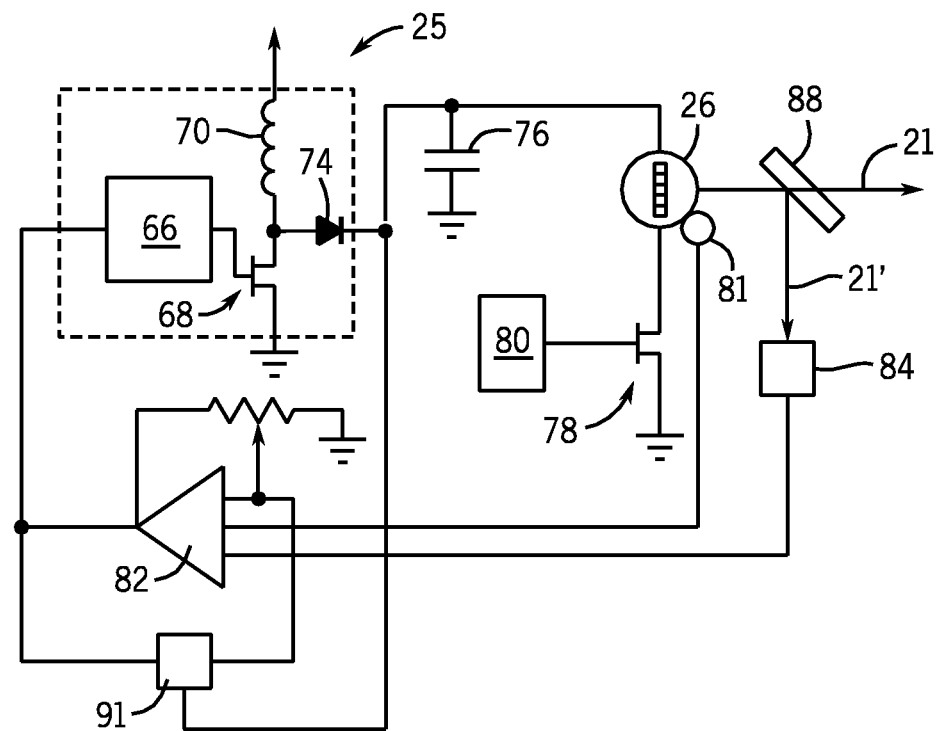
FIG. 6 is a block diagram similar to that of FIG. 4 showing another embodiment providing optical power sensing to deduce of quantum cascade power output.

Referring now to FIG. 6 in an alternative embodiment the sensing resistor 81 is eliminated in favor of an optical detector 84 (such as a photodiode) receiving a portion 21' of the laser beam 21, for example, as diverted by beam splitter 88. The optical detector 84 may thus provide a direct measurement of the power output by the quantum cascade laser element 26 indirectly determining its power dissipation. The signal from the optical detector 84 is received by amplifier 82 which provides a control signal to circuit 66. In addition, a temperature sensing element 89, such as a thermistor, may be included to sense the actual laser temperature and provide a feedback signal that is summed at amplifier 82 to increase or decrease the current set-point as required for different laser temperatures. Otherwise the driver circuit 25 may be unchanged.

Figure 7:
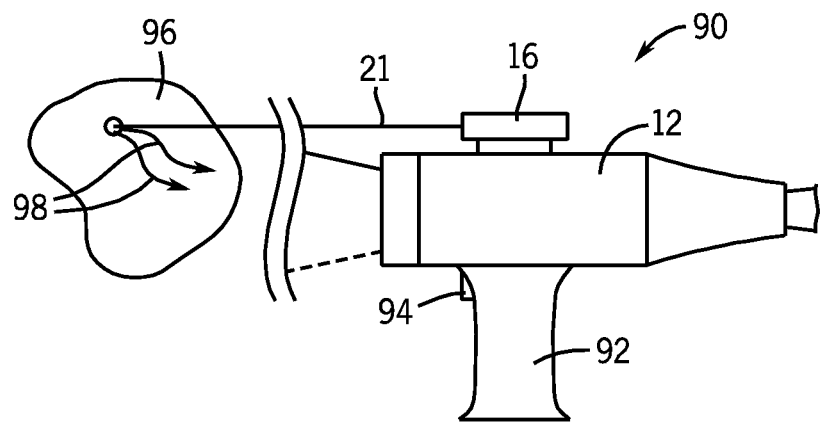
FIG. 7 is a perspective view of a handheld remote laser spectroscopy system such as may make use of the laser in accordance with an embodiment of the present invention.

Referring now to FIG. 7, the ability to provide a highly portable, high powered, infrared source permits the construction of a handheld remote spectroscope 90 in which the quantum cascade laser 16 is attached to the housing of the spectroscope 90 having a handgrip 92 and activation button 94. By pressing the activation button, the quantum cascade laser 16 is activated. As with the laser sight system described above, an imaging device 12 (thermal, near infrared, or visible) may be used with the laser 16, but in this case, the imaging device 12 is used to view and analyze signature emissions 98 that occur when the laser beam 21 illuminates an unknown gas sample 96. When the emission wavelength of the source is equal to the wavelength of absorption for the gas, the gas will absorb the emission and the spectroscope will detect this difference. A device providing qualitative or quantitative system to detect hazardous materials may thus be constructed.

The foregoing description of embodiments has been presented for purposes of illustration and description. The foregoing description is not intended to be exhaustive or to limit embodiments of the present invention to the precise form disclosed, and modifications and variations are possible in light of the above teachings or may be acquired from practice of various embodiments. The embodiments discussed herein were chosen and described in order to explain the principles and the nature of various embodiments and its practical application to enable one skilled in the art to utilize the present invention in various embodiments and with various modifications as are suited to the particular use contemplated. The features of the embodiments described herein may be combined in all possible combinations of methods, apparatus, modules and systems.

The invention claimed is:

1. A laser assembly comprising:
a housing;
a quantum cascade element coupled to the housing; and
a driver circuit that directs a set of controlled pulses of power to the quantum cascade element, wherein the pulses of power to the quantum cascade element are adjusted to hold the quantum cascade element within an operating range allowing for passive cooling of the quantum cascade element; wherein the pulses of power from the driver circuit have a voltage that is above a lasing threshold voltage required to begin laser action of the quantum cascade element; wherein the pulses of power from the driver circuit have a duty cycle that is above a predetermined duty cycle threshold required to provide sufficient output power of the laser assembly; and wherein the duty cycle is greater than one percent.

2. The laser assembly of claim 1 wherein the driver circuit dynamically adjusts the duty cycle based on feedback relating to the quantum cascade element.

3. The laser assembly of claim 2 wherein the feedback is selected from a group consisting of (i) the power consumed by the quantum cascade element, (ii) the current directed to the quantum cascade element; (iii) a temperature of the quantum cascade element, and (iv) a voltage applied to the quantum cascade element.

4. The laser assembly of claim 1 further comprising a battery that provides power to the driver circuit, and wherein the driver circuit includes a DC-to-DC boost converter that receives the power from the battery.

5. The laser assembly of claim 2 wherein the feedback is the optical output from the quantum cascade element.

6. A laser targeting system comprising: (i) a rifle having a bore, and (ii) the laser assembly of claim 1 attached to the rifle; wherein the laser assembly provides an infrared laser beam having a wavelength greater than approximately 3 microns and substantially aligned with the bore of the rifle.

7. A laser spectroscope comprising: (i) an infrared imaging system that provides an image, and (ii) the laser assembly of claim 1 directing an infrared laser beam having a wavelength greater than approximately 3 microns, the laser beam impinging on the image.

8. The laser assembly of claim 2 wherein the feedback relates to the power consumed by the quantum cascade element.

9. The laser assembly of claim 2 wherein the feedback relates to the current directed to the quantum cascade element.

10. The laser assembly of claim 2 wherein the feedback relates to a temperature of the quantum cascade element.

11. The laser assembly of claim 2 wherein the feedback relates to a voltage applied to the quantum cascade element.

12. The laser assembly of claim 2 further comprising a battery that provides power to the driver circuit, and wherein the driver circuit includes a DC-to-DC boost converter that receives the power from the battery.

13. The laser assembly of claim 1 wherein the driver circuit dynamically adjusts a duration of the pulses of power.

14. The laser assembly of claim 1 wherein the driver circuit dynamically adjusts a frequency of the pulses of power.

* * * * *